US 006657463B2

(12) United States Patent
Velez

(10) Patent No.: US 6,657,463 B2
(45) Date of Patent: Dec. 2, 2003

(54) SYSTEM FOR MAINTAINING THE STABILITY OF A PROGRAMMABLE FREQUENCY MULTIPLIER

(75) Inventor: Didier Joseph Marie Velez, Carmel, IN (US)

(73) Assignee: Thomson Licensing S.A., Boulogne (FR)

( * ) Notice: Subject to any disclaimer, the term of this patent is extended or adjusted under 35 U.S.C. 154(b) by 174 days.

(21) Appl. No.: 10/017,618

(22) Filed: Dec. 14, 2001

(65) Prior Publication Data

US 2003/0115497 A1 Jun. 19, 2003

(51) Int. Cl.$^7$ ............................................... H03B 19/00
(52) U.S. Cl. ....................... 327/116; 327/119; 327/142; 327/146; 327/151; 327/153; 327/299
(58) Field of Search ................................. 327/116, 119, 327/142, 146, 151, 153, 299

(56) References Cited

U.S. PATENT DOCUMENTS 4,851,709 A * 7/1989 Bailey ........................ 307/228
5,729,166 A * 3/1998 May et al. .................. 327/116

* cited by examiner

Primary Examiner—Margaret R. Wambach
(74) Attorney, Agent, or Firm—Joseph S. Tripoli; Joseph J. Laks; Ronald H. Kurdyla

(57) ABSTRACT

A programmable frequency multiplier receives data representing a desired multiplication ratio from a first configuration register. The ratio data is transferred to the frequency multiplier concurrently with the generation of an internal delayed reset signal which holds all configuration registers in a reset condition until the frequency multiplier achieves a locked state. The configuration registers are dependent upon the internal clock signal generated by the frequency multiplier for proper operation. By causing the configuration registers to renew operation only after the stable frequency multiplier operation the danger of corrupting the information in the configuration registers is minimized.

10 Claims, 2 Drawing Sheets

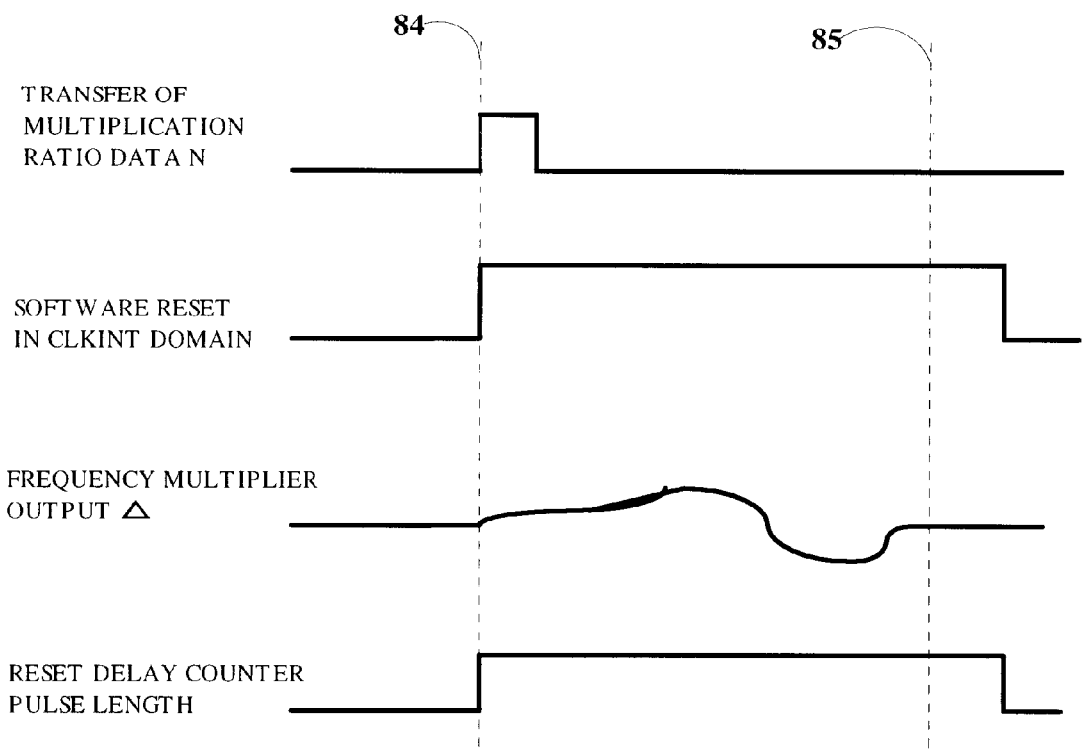
Fig. 2 -

SYSTEM FOR MAINTAINING THE STABILITY OF A PROGRAMMABLE FREQUENCY MULTIPLIER

FIELD OF THE INVENTION

This invention pertains generally to any network using a frequency multiplier where the multiplication ratio is programmable through a configuration register.

BACKGROUND OF THE INVENTION

In an integrated circuit (IC) containing a frequency multiplier all operations and processing are typically controlled by a voltage controlled oscillator (VCO) which directly or indirectly produces an output clock signal. Changing the multiplication ratio of the frequency multiplier usually creates an unstable period for the voltage controlled oscillator which is itself part of a phase locked loop (PLL). During this period of instability, the output clock signal may vary above or below the desired frequency before finally locking onto the selected output clock frequency. Since the IC uses the output clock to control its processing functions, the processing may be corrupted during the period of clock instability. Further, the frequency multiplier output clock is used to control the configuration register in which the desired multiplication ratio is stored. If the output clock signal is disturbed the desired multiplication ratio may be lost. This condition may result in a permanently unlocked condition caused by an endless loop in which the desired change in the multiplication ratio leads to frequency instability, which leads to improper latching of the new multiplication ratio, which leads to a random change in the multiplication ratio, which leads to frequency instability, and so forth. That is, a change in the multiplication ratio leads to a condition in which the multiplication ratio is continuously altered. In addition, ideally, the frequency multiplier output clock should always be enabled without cessation or interruption by any gating or other logical function.

A clock control scheme is disclosed by Walsh et al. in U.S. Pat. No. 5,842,005 entitled CLOCK CONTROL CIRCUITS, SYSTEMS AND METHODS.

Walsh et al. utilizes a clock gate which receives a clock control signal to prevent clock pulses from reaching a central processing unit within one cycle of a change in the clock control signal. However, as described above, such gating of the clock signal is generally undesirable.

SUMMARY OF THE INVENTION

The present invention addresses the need to provide a simple and reliable method of changing the multiplication ratio of a programmable frequency multiplier. The output clock signal of the frequency multiplier is used to control circuitry used for programming of the desired multiplication ratio. Two clock domains are defined in the present invention. A first clock domain is the Reference Clock Domain which contains all of the cells or components which derive their function from the input reference clock signal of the integrated circuit. A second clock domain is the Internal Clock Domain which contains all of the cells or components which derive their function from the output clock signal of the frequency multiplier. This second clock domain includes all of the IC operation and processing blocks and therefore represents most of the components of the IC.

The Internal Clock Domain includes a Software Reset configuration register which controls changes in the multiplication ratio. In general, a change in clock frequency (induced by a change in the frequency multiplication ratio) is a critical operation at which time a reset of the internal clock domain circuits is possible. When the multiplication ratio is to be altered, the software configuration register conditions the multiplication ratio data to be latched at the control input terminal of the frequency multiplier concurrently with the generation of a software reset command to the cells within the Internal Clock Domain as synchronized by the reference clock signal. The Software Reset configuration register will, therefore, be reset concurrently with a change in the multiplication ratio. Resetting the Software Reset configuration register in this manner prevents the contents of this register from being corrupted, thereby preventing random frequency changes to the frequency multiplier during the period of instability and insures that the multiplication ratio being passed to the frequency multiplier will remain stable.

BRIEF DESCRIPTION OF THE DRAWINGS

FIG. 2 is a timing diagram depicting the relationship between various operations performed by the circuitry depicted in FIG. 1.

DETAILED DESCRIPTION OF THE INVENTION

Figure 1:
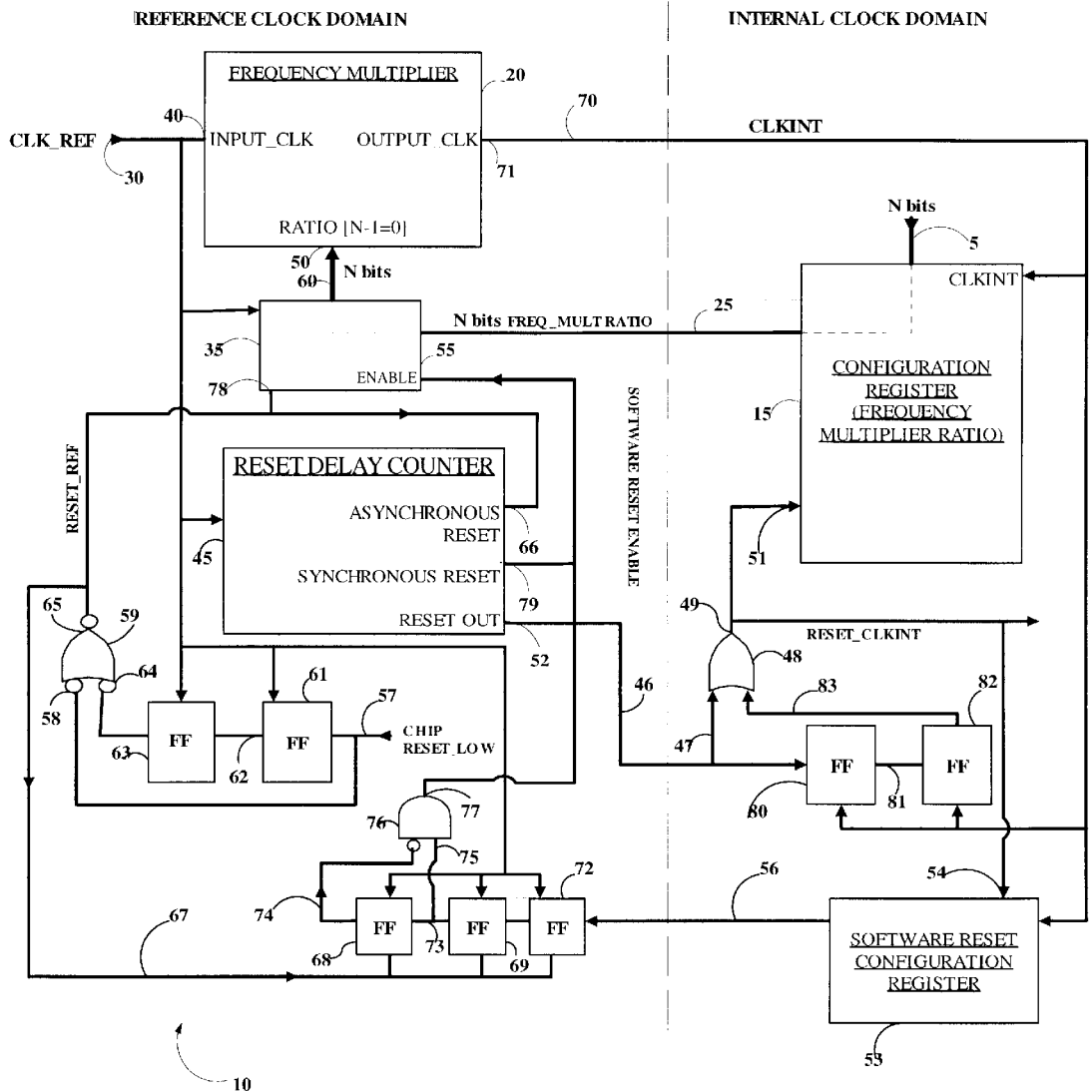
FIG. 1 is a block diagram of a portion of an integrated circuit including a programmable frequency multiplier, reset delay circuit and configuration registers embodied on single monolithic chip according to the principles of the present invention.

FIG. 1 depicts a circuit 10 which includes a programmable frequency multiplier 20. A CLK_REF (reference clock) signal 30 provides an external timing source to the INPUT_CLK (input clock) terminal 40 of frequency multiplier 20 as well as other components of circuit 10. The frequency multiplier 20 is programmable and receives at terminal 50 a control input signal 60 containing N bits, where N is an integer greater than 1. The multiplication ratio of the frequency multiplier 20 is controlled by the value of the integer represented by the N bit control signal. The OUTPUT_CLK (output clock) terminal 71 produces a clock signal CLKINT 70 for the internal clock domain having a frequency which is equal to a predetermined function of the control input signal multiplied by the frequency of the CLK-REF signal 30.

Programming the frequency multiplier 20 begins along signal path 5, which serves as the input to a configuration register 15, which, in the illustrated embodiment is a set of N D-type flip-flops arranged in parallel in a known manner. The clock signal received by configuration register 15 is the internal clock signal CLKINT 70. The programming information from signal path 5 is latched in the configuration register 15 by the clock signal CLKINT 70 and becomes the output signal 25 of configuration register 15. The signal 25 is coupled to an input terminal of a data latch 35, the output signal 60 of which is coupled to the control input terminal 50 to the frequency multiplier 20.

Whenever a change in the multiplication ratio of the frequency multiplier 20 is made, a Reset Delay Counter 45 generates a reset signal at an output terminal 52, causing signal path 46 to have a logic level 1 value, which in the illustrated embodiment is a represented by a high signal level. The reset signal 52 remains at a high level for a period of time that is greater than the maximum search or lockup time for the frequency multiplier 20. In the illustrated embodiment, the Reset Delay Counter 45 is implemented in a known manner as a counter counting a predetermined number of reference clock signal CLK_REF 30 clock pulses to generate the reset signal 52 of the predetermined duration. However, one skilled in the art will understand that any circuit which is capable of generating a signal of at least a predetermined duration in response to an input signal may be used instead.

The reset delay counter 45 is triggered by either a synchronous software reset signal from the software reset configuration register 53 (described in more detail below), or a hardware asynchronous reset signal from NOR gate 59. When the integrated circuit chip is powered on, the CHIP_RESET_LOW input terminal 57 is maintained in a low state for a specified duration to allow all the latches in the integrated circuit chip to be powered up and then placed into a predetermined state, in a known manner. In general, the CHIP_RESET_LOW signal is used to place the circuit elements in the reference clock domain in a predetermined condition.

Input terminal 57 is coupled to one input terminal 58 of an inverting input NOR gate 59. The chip reset input terminal 57 is also coupled to the input terminal to D Flip-Flop 61 having output terminal 62 coupled to the input terminal to D Flip Flop 63. The output terminal of D Flip Flop 63 is coupled to the second input terminal 64 to NOR gate 59. The flip-flops 61 and 63 ensure that the software reset signal 56 from the software reset configuration register 53 is resynchronized to the reference clock signal CLK_REF 30. Two flip-flops 61 and 63 are used to prevent metastability problems. The reset signal RESET_REF at output terminal 65 of NOR gate 59 remains low as long as the chip reset signal 57 remains low, and is supplied to the asynchronous reset input terminal 66 of the reset delay counter 45. The RESET_REF signal also serves as the reset input signal 67 to D Flip-Flops 68, 69 and 72 and the data latch 35. In response, the data latch 35 is set to a default, predetermined, frequency ratio N for the frequency multiplier 20. When the chip reset signal at input terminal 66 is removed, the reset delay counter 45 provides a control signal to reset the internal clock domain in a manner to be described below.

The reset control signal path 46 is coupled to one input terminal 47 of an OR gate 48. Whenever the output terminal 49 of OR gate 48 goes high the output terminal 49 serves as the RESET_CLKINT or internal clock reset signal 51 to a frequency multiplier configuration register 15, the software reset configuration register 53, and the remainder of the circuitry in the internal clock domain. The reset signal 51 is held at logic level 1 for a sufficient duration to permit the frequency multiplier output signal 70 to stabilize. In this manner all components in the internal clock domain are receiving a stabilized clock signal 70 when those components activate or wake up after receiving the RESET_CLKINT signal 51.

The signal input to Flip-Flop 72 is the output signal 56 from the software reset configuration register 53. In the illustrated embodiment, the software reset configuration register 53 is implemented as a single D flip-flop. The output terminal of flip-flop 72 is coupled to the input terminal of flip-flop 69. The output signal 73 of Flip-Flop 69 serves as both the input 75 of AND gate 76 as well as the input to Flip-Flop 68. The output 74 of Flip-Flop 68 is supplied to the inverting input of the AND gate 76. Whenever the Flip-Flop output signal 74 is low and the Flip-Flop output signal 73 is high the output signal 77 of AND gate 76 goes high. The signal 77 is a pulse which occurs for one period of the reference clock signal CLK_REF 30 when a software reset signal 56 is generated by the software reset configuration register 53. AND gate 76 output terminal 77 is coupled to the enabling input terminal 55 of the latch 35 and thereby enabling the new frequency multiplication data N to be latched in the latch 35 at the next clock pulse of the reference clock signal CLK_REF 30. This multiplication data N is subsequently transferred to the frequency multiplier 20. The reset signal pulse 77 also serves as the input signal to the synchronous reset terminal 79 of reset delay counter 45 thereby enabling the reset delay counter 45 at the next clock pulse of the reference clock signal CLK_REF 30. Thus, when a software reset is triggered by the software reset configuration register 53, the frequency multiplication data in the frequency ratio configuration register 15 is latched in the data latch 35 simultaneously with the generation of a delayed reset signal 52 by the reset delay counter 45 as synchronized by the next edge of the reset delay counter 45.

When either the asynchronous reset terminal 66 or the synchronous reset terminal 79 is activated, the delayed reset signal 52 is sent along signal path 46 and holds the components in the internal clock domain in a reset mode for a sufficient time period to permit the frequency multiplier 20 to a achieve a stable state. The delayed reset signal path 46 serves as the input to Flip-Flop 80 which has an output 81 serving as the input of Flip-Flop 82. The output 83 of Flip-Flop 82 is coupled to the second input of the OR gate 48. A high signal at either input of OR gate 48 will generate the RESET_CLKINT signal 49 which holds the frequency multiplier ratio configuration register 15, the software configuration register 53, and all other circuitry (not shown) in the internal clock domain, in a reset condition until the frequency multiplier 20 has had an opportunity to lock. The flip-flops 80 and 82 ensure that the end of the internal clock domain reset signal RESET_CLKINT is synchronized to the stabilized internal clock signal CLKINT, and prevents metastability problems.

In FIG. 2, the time 84 corresponds to the beginning of the data transfer N along signal path 60. The topmost waveform illustrates the one clock period pulse from the AND gate 76 in response to a software reset signal from the software reset configuration register 53. This pulse is synchronized to the reference clock signal CLK_REF, and simultaneously latches the frequency multiplier ratio data N into the data latch 35 and initiates a delayed reset signal from the reset delay counter 45. The RESET_CLKINT signal, illustrated in the second waveform, appears at terminals 51 and 54, and remains there for the duration of the delayed reset output signal 52. The third waveform illustrates the frequency output of the frequency multiplier 20, and shows that that frequency becomes unstable when a new frequency multiplication ratio is received at time 84. Time 85 corresponds to the maximum lockup time of the frequency multiplier 20. It is seen that the delayed reset signal, illustrated in the fourth waveform, remains active until after the maximum lockup time of the frequency multiplier 20. In this manner, the system as a whole operates in a stable manner through a change in the multiplication ratio.

The same circuitry as has just been described may also be used in conjunction with a processor which uses a programmable frequency multiplier for changing its internal clock speed. The method just described for passing the multiplication ratio data N could also be adapted to be used to pass a new boot address for a processor, configuring the clock speed or multiplication ratio at the beginning of the program, or initiating use of a new instruction set. Such tasks could be accomplished by performing the following steps:

| | |
|---|---|
| Hard reboot: | Boot at hard boot address |
| | Write the contents of the frequency multiplication ratio configuration register |
| | Write the contents of the software reboot address configuration register |
| | Perform a soft reboot |
| Soft reboot: | Boot at the software reboot address |
| | Run main program |

What is claimed is:

1. A programmable frequency multiplier, comprising:

a ratio configuration register, coupled to the frequency multiplier, specifying a multiplication ratio to be utilized by the frequency multiplier; and a reset delay circuit, coupled to the ratio configuration register, for generating a reset signal having a delay period starting when the multiplication ratio is transferred to the frequency multiplier and ending after the frequency multiplier has achieved a stable operating condition and conditioning the ratio configuration register to inhibit operation during the delay period.

2. The programmable frequency multiplier of claim 1, further comprising a utilization means coupled to the frequency multiplier and responsive to the reset signal, wherein operation of the utilization means is inhibited during the delay period.

3. The programmable frequency multiplier of claim 1, further comprising a software reset configuration register, coupled to the reset delay circuit and the ratio configuration register, for concurrently conditioning the reset delay circuit to generate the reset signal and the ratio configuration register to transfer the multiplication ratio, and being responsive to the reset signal to inhibit operation during the delay period.

4. The programmable frequency multiplier of claim 1, further comprising a data latch interconnected between the ratio configuration register and the frequency multiplier, the data latch transferring the multiplication ratio to the frequency multiplier at least as early as the beginning of the delay period.

5. A method of stabilizing the frequency of a programmable frequency multiplier, comprising the steps of:

transferring a desired frequency multiplication ratio to the frequency multiplier; and inhibiting operation of components dependent on stable operation of the frequency multiplier during a period beginning at least concurrently with a transfer of the multiplication ratio to the frequency multiplier and ending after stable operation of the frequency multiplier has been achieved.

6. The method of claim 5, further comprising the steps of:

generating a reset signal beginning concurrently with the transfer of the multiplication ratio to the frequency multiplier and ending after stable operation of the frequency multiplier has been achieved; and coupling the reset signal to at least some components dependent upon stable operation of the frequency multiplier.

7. The method of claim 6, further comprising the steps of:

generating an internal clock signal derived from the frequency multiplier; and coupling the internal clock signal to a configuration register containing the multiplication ratio such that the configuration register is dependent upon the internal clock signal for proper operation.

8. The method of claim 7, further comprising the step of coupling the reset signal to the configuration register substantially simultaneously with a transfer of the multiplication ratio to the frequency multiplier.

9. The method of claim 8, further comprising the step of maintaining the configuration register in a reset condition until the frequency multiplier has achieved a stable operating condition.

10. A system, comprising:

a programmable frequency multiplier, responsive to data representing a frequency multiplier ratio for generating an internal clock signal, and exhibiting a period of frequency instability for a predetermined maximum time duration in response to a change in the frequency multiplier ratio data;

an internal clock domain, comprising circuitry responsive to the internal clock signal and a reset signal; and a reference clock domain, comprising a reset circuit generating the reset signal having a duration longer than the maximum frequency instability time duration in response to a change in the frequency multiplier ratio data.

* * * * *